US012695399B2

(12) United States Patent
Shimoda et al.

(10) Patent No.: US 12,695,399 B2
(45) Date of Patent: Jul. 28, 2026

(54) ELECTROSTATIC CHUCK, SUBSTRATE SUPPORT, AND SUBSTRATE PROCESSING APPARATUS

(71) Applicant: Tokyo Electron Limited, Tokyo (JP)

(72) Inventors: Masashi Shimoda, Miyagi (JP); Yasuharu Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 174 days.

(21) Appl. No.: 18/443,834

(22) Filed: Feb. 16, 2024

(65) Prior Publication Data

US 2024/0186917 A1 Jun. 6, 2024

Related U.S. Application Data

(63) Continuation of application No. PCT/JP2022/030261, filed on Aug. 8, 2022.

(60) Provisional application No. 63/235,231, filed on Aug. 20, 2021.

(30) Foreign Application Priority Data

Sep. 10, 2021 (JP) ................................. 2021-148145

(51) Int. Cl.
*H02N 13/00* (2006.01)
*C23C 16/458* (2006.01)

(52) U.S. Cl.
CPC ......... *H02N 13/00* (2013.01); *C23C 16/4586* (2013.01)

(58) Field of Classification Search
CPC .. H02N 13/00; C23C 16/458; C23C 16/4586; H01L 21/6833; H01L 21/683; H01L 21/67109

USPC .......................................................... 361/234
See application file for complete search history.

(56) References Cited

U.S. PATENT DOCUMENTS

| | | | |
|---|---|---|---|
| 2002/0027762 A1* | 3/2002 | Yamaguchi | ............. G03F 7/707 279/128 |
| 2004/0040665 A1* | 3/2004 | Mizuno | .................. H02N 13/00 118/728 |
| 2004/0218339 A1* | 11/2004 | Nakamura | .......... H01L 21/6831 361/234 |

(Continued)

FOREIGN PATENT DOCUMENTS

| | | |
|---|---|---|
| JP | 2013-153171 A | 8/2013 |
| JP | 2018-186179 A | 11/2018 |

OTHER PUBLICATIONS

International Search Report and Written Opinion mailed on Oct. 18, 2022, received for International Patent Application No. PCT/JP2022/030261, filed on Aug. 8, 2022, 11 pages including English Translation.

*Primary Examiner* — Danny Nguyen
(74) *Attorney, Agent, or Firm* — XSENSUS LLP

(57) ABSTRACT

An electrostatic chuck, includes: a central region configured to support a substrate; at least one through-hole formed in the central region; a first substrate contact portion arranged around the through-hole; and a second substrate contact portion arranged around the first substrate contact portion. The first substrate contact portion and the second substrate contact portion have protrusions protruding upward from the central region. The protrusions are arranged in the first substrate contact portion at a first density. The protrusions are arranged in the second substrate contact portion at a second density lower than the first density.

19 Claims, 9 Drawing Sheets

(56)                    References Cited

U.S. PATENT DOCUMENTS

2005/0207089 A1 *    9/2005   Ito ........................... G03F 7/707
                                                    361/234

* cited by examiner

ELECTROSTATIC CHUCK, SUBSTRATE SUPPORT, AND SUBSTRATE PROCESSING APPARATUS

CROSS-REFERENCE TO RELATED APPLICATIONS

This application is a bypass continuation application of International Patent Application No. PCT/JP2022/030261 having an international filing date of Aug. 8, 2022 and designating the United States, the international application being based upon and claiming the benefit of priority from U.S. Patent Application No. 63/235,231 and Japanese Patent Application No. 2021-148145, filed on Aug. 20, 2021 and Sep. 10, 2021, respectively, the entire contents of each are incorporated herein by reference.

TECHNICAL FIELD

The present disclosure relates to an electrostatic chuck, a substrate support, and a substrate processing apparatus.

BACKGROUND

Patent Document 1 discloses an electrostatic chuck including a hole used for a lift pin and a hole used for ionized gas supply and exhaust.

PRIOR ART DOCUMENT

Patent Document

Patent Document 1: Japanese Patent Laid-Open Publication No. 2008-186179

SUMMARY

According to one embodiment of the present disclosure, an electrostatic chuck includes a central region configured to support a substrate, at least one through-hole formed in the central region, a first substrate contact portion arranged around the through-hole, and a second substrate contact portion arranged around the first substrate contact portion. The first substrate contact portion and the second substrate contact portion have protrusions protruding upward from the central region. The protrusions are arranged in the first substrate contact portion at a first density, and the protrusions are arranged in the second substrate contact portion at a second density lower than the first density.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 9 is an enlarged plan view of the periphery of a through-hole of an electrostatic chuck according to a third embodiment.

FIG. 10 is a longitudinal cross-sectional view of the periphery of the through-hole illustrated in FIG. 9.

DETAILED DESCRIPTION

Figure 1:
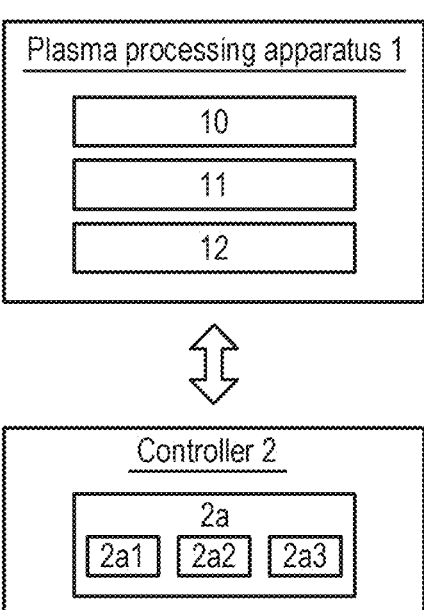
FIG. 1 is a view for explaining a configuration example of a plasma processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, plasma processing is performed on a semiconductor substrate (hereinafter referred to as a "substrate"), for example, in a plasma processing apparatus. In the plasma processing apparatus, plasma is generated by exciting a process gas within a chamber, and the substrate supported by an electrostatic chuck is processed by the plasma.

In plasma processing, it is required to properly control the temperature of the substrate to be processed in order to improve the in-plane uniformity of plasma processing on the substrate. Therefore, the temperature of the substrate is controlled, for example, by supplying a heat transfer gas such as helium gas to a space between a rear surface of the substrate and a front surface of the electrostatic chuck and controlling the pressure of the heat transfer gas.

The electrostatic chuck includes a through-hole for supplying the heat transfer gas. The electrostatic chuck also includes, for example, a through-hole into which a lifter pin for delivering the substrate is inserted.

In plasma processing, the in-plane uniformity of plasma processing can be enhanced by reducing the number of places in which the temperature of the substrate becomes partially high (hereinafter referred to as "temperature singularity"). In the vicinity of the through-hole, the temperature singularity of the substrate is likely to occur during plasma processing.

Therefore, a technique according to the present disclosure suppresses occurrence of the temperature singularity of the substrate in the vicinity of the through-hole of the electrostatic chuck.

Hereinafter, a substrate processing apparatus, a substrate support, and an electrostatic chuck according to the present embodiment will be described with reference to the drawings. In the present specification and drawings, elements having substantially the same functional configuration are denoted by the same reference numerals to omit duplicate description.

<Plasma Processing System>

First, a plasma processing system according to an embodiment will now be described with reference to FIG. 1. FIG. 1 is a view for explaining a configuration example of a plasma processing system.

In an embodiment, the plasma processing system includes a plasma processing apparatus 1 and a controller 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. In addition, the plasma processing chamber 10 includes at least one gas supply port for supplying at least one process gas to the plasma processing space and at least one gas discharge port for discharging a gas from the plasma processing space. The gas supply port is connected to a gas supplier 20 described later, and the gas discharge port is connected to an exhaust system 40 described later. The substrate support 11 is arranged in the plasma processing space and has a substrate support surface for supporting the substrate.

The plasma generator 12 is configured to generate plasma from at least one process gas supplied into the plasma processing space. The plasma formed in the plasma processing space may be capacitively coupled plasma (CCP), inductively coupled plasma (ICP), electron-cyclotron-resonance (ECR) plasma, helicon wave plasma (HWP), surface wave plasma (SWP), or the like. Various types of plasma generators including an alternating current (AC) plasma generator and a direct current (DC) plasma generator may be used. In an embodiment, an AC signal (AC power) used in the AC plasma generator has a frequency in a range of 100 kHz to 10 GHz. Therefore, the AC signal includes a radio frequency (RF) signal and a microwave signal. In an embodiment, the RF signal has a frequency in a range of 100 kHz to 150 MHz.

The controller 2 processes computer-executable instructions that cause the plasma processing apparatus 1 to perform various processes described in the present disclosure. The controller 2 may be configured to control each element of the plasma processing apparatus 1 to perform various processes described herein. In an embodiment, a part or all of the controller 2 may be included in the plasma processing apparatus 1. The controller 2 may include a processor 2a1, a memory part 2a2, and a communication interface 2a3. The controller 2 is implemented by, for example, a computer 2a. The processor 2a1 may be configured to perform various control operations by reading a program from the memory part 2a2 and executing the read program. This program may be stored in the memory part 2a2 in advance and may be acquired via a medium when needed. The acquired program is stored in the memory part 2a2, and is read from the memory part 2a2 and executed by the processor 2a1. The medium may be a variety of storage media readable by the computer 2a and may be a communication line connected to the communication interface 2a3. The processor 2a1 may be a central processing unit (CPU). The memory part 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 2:
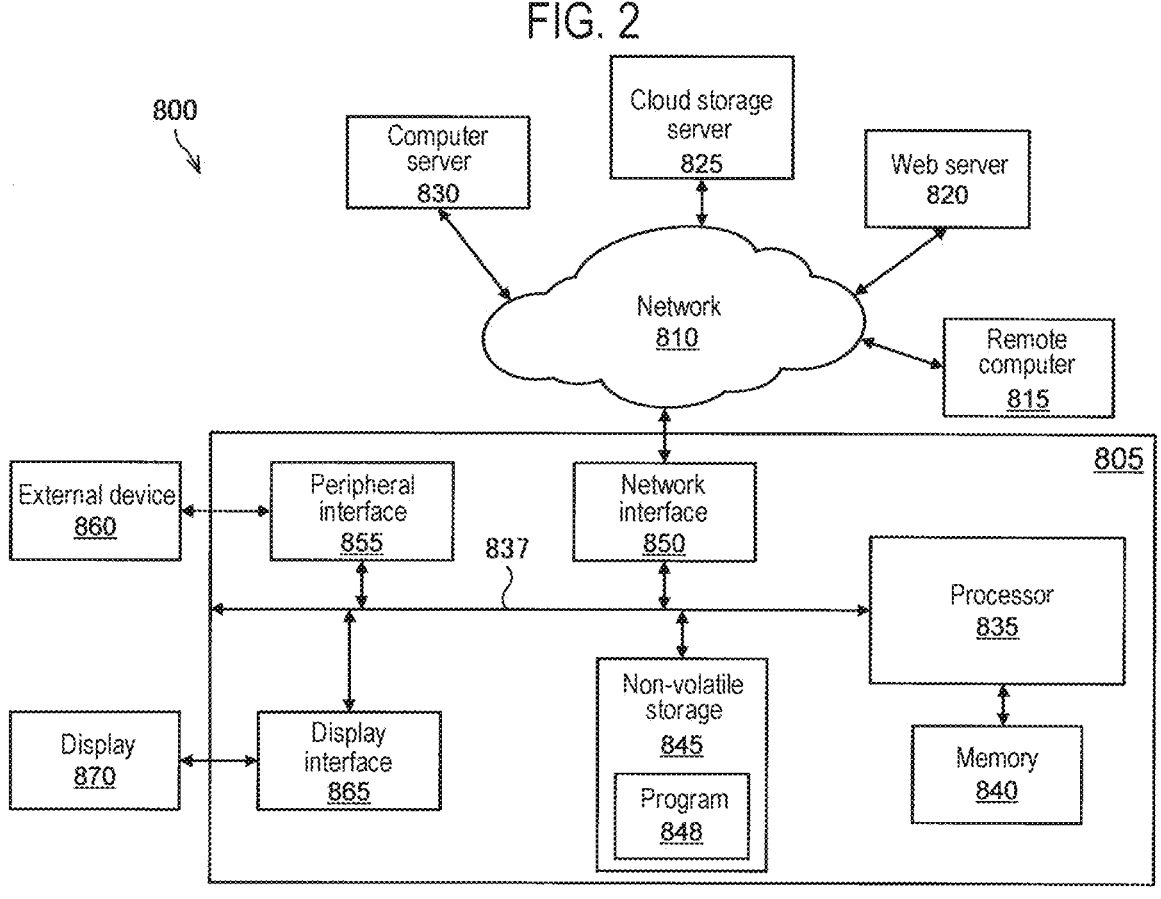
FIG. 2 is a block diagram of a computer capable of implementing various embodiments.

FIG. 2 is a block diagram of a computer capable of implementing various embodiments described in the present specification. The control aspects of the present disclosure may be embodied as a system, a method, and/or a computer program product. The computer program product includes a computer readable storage medium in which computer readable program instructions are recorded, and one or multiple processors are capable of executing aspects of the embodiments.

The computer readable storage medium may be a tangible device capable of storing instructions for use by an instruction execution device (processor). The computer readable storage medium may include, for example, an electronic storage device, a magnetic storage device, an optical storage device, an electromagnetic storage device, a semiconductor storage device, or any suitable combination of these devices but is not limited thereto. A non-exhaustive list of more specific examples of the computer readable storage medium (and an appropriate combination) includes each of the following: a floppy disk, a hard disk, a solid state drive (SSD), a random access memory (RAM), a read only memory (ROM), a programmable read only memory (EPROM or flash), a static random access memory (SRAM), a compact disc (CD or CD-ROM), a digital universal disc (DVD), and a memory card or stick. The computer readable storage medium as used in the present disclosure should not be construed as being transitory signals per se, such as radio waves or other freely propagating electromagnetic waves, electromagnetic waves propagating through a waveguide or other transmission media (e.g., light pulses passing through a fiber optic cable), or electrical signals transmitted through a wire.

Computer readable program instructions described in the present disclosure may be downloaded to an appropriate computing device or processing device from the computer readable storage medium or to an external computer or an external storage device via a global network (i.e., the Internet), a local area network, a wide area network (WAN), and/or a wireless network. The networks may include copper wires, optical communication fibers, wireless transmission, routers, firewalls, switches, gateway computers, and edge servers. A network adapter card or network interface of each computing device or processing device may receive the computer readable program instructions from the network and forward the computer readable program instructions for storage in the computer readable storage medium within the computing device or processing device.

The computer readable program instructions for carrying out operations of the present disclosure may include machine language instructions and/or microcode and may be compiled or interpreted from source code written in any combination of one or multiple programming languages, including assembly language, Basic, Fortran, Java, Python, R, C, C++, C#, or similar programming languages. The computer readable program instructions may be executed entirely on a personal computer, a notebook computer, a tablet, or a smartphone of a user or may be executed entirely on a remote computer or a computer server or in any combination of these computing devices. The remote computer or the computer server may be connected to a device of the user or a device via a local area network or a WAN, or a computer network including a global network (the Internet). In some embodiments, electronic circuitry including, for example, a programmable logic circuit, a field programmable gate array (FPGA), or a programmable logic array (PLA) executes the computer readable program instructions by utilizing information from the computer readable program instructions to configure or customize the electronic circuitry, in order to perform aspects of the present disclosure.

Aspects of the present disclosure are described with reference to flowcharts and block diagrams of methods, apparatuses (systems), and computer program products according to embodiments of the disclosure. Those skilled in the art will appreciate that each block of the flowcharts and block diagrams, and combinations of blocks in the flowcharts and block diagrams may be implemented by computer readable program instructions.

The computer readable program instructions capable of implementing the systems and methods described in the present disclosure may be provided to one or multiple processors (and/or one or multiple cores in a processor) of a general purpose computer, a special purpose computer, or other programmable apparatuses. These computer readable program instructions may be stored in a computer readable storage medium that may instruct a computer, a programmable apparatus, and/or other devices to function in a particular manner. In this case, the computer readable storage medium storing the instructions is a product that includes instructions that implement functional aspects specified in the flowcharts and block diagrams of the present disclosure.

The computer readable program instructions may also be loaded onto computers, other programmable apparatuses, or other apparatuses to cause a series of operational steps to be performed to generate a computer implemented process, such that instructions executed on the computers, other programmable apparatuses, or other apparatuses implement the functions specified in the flowcharts and block diagrams of the present disclosure.

FIG. 2 is a functional block diagram illustrating a networked system 800 of one or multiple networked computers and servers. In an embodiment, hardware and software environments illustrated in FIG. 2 may provide an exemplary platform for implementation of software and/or methods according to the present disclosure.

As illustrated in FIG. 2, the networked system 800 may include, without being limited to, a computer 805, a network 810, a remote computer 815, a web server 820, a cloud storage server 825, and a computer server 830. In some embodiments, multiple instances of one or multiple functional blocks illustrated in FIG. 2 may be employed.

Additional details of the computer 805 are illustrated in FIG. 2. The functional blocks illustrated in the computer 805 are provided only to establish exemplary functions and are not intended to be exhaustive. Although no details are provided for the remote computer 815, the web server 820, the cloud storage server 825, and the computer server 830, these other computers and devices may include similar functionality shown for the computer 805.

The computer 805 may be a personal computer (PC), a desktop computer, a laptop computer, a tablet computer, a netbook computer, a personal digital assistant (PDA), a smartphone, or any other programmable electronic devices capable of communicating with other devices on the network 810.

The computer 805 may include a processor 835, a bus 837, a memory 840, a non-volatile storage 845, a network interface 850, a peripheral interface 855, and a display interface 865. Each of functions of these elements may, in some embodiments, be implemented as an individual electronic subsystem (an integrated circuit chip or a combination of a chip and an associated device), or in other embodiments, a combination of functions to some extent may be implemented on a single chip (sometimes referred to as a system-on-chip or SoC).

The processor 835 may be one or multiple single or multi-chip microprocessors.

The bus 837 may be a proprietary standard fast parallel or serial peripheral interconnect bus, such as ISA, PCI, PCI Express (PCI-e), AGP, etc.

The memory 840 and the non-volatile storage 845 may be computer readable storage media. The memory 840 may include any suitable volatile storage devices, such as a dynamic random access memory (DRAM) and a static random access memory (SRAM). The non-volatile storage 845 may include one or multiple of a floppy disk, a hard disk, a solid state drive (SSD), a read only memory (ROM), a programmable read only memory (EPROM or flash), a compact disc (CD or CD-ROM), a digital versatile disc (DVD), and a memory card or stick.

The program 848 may be a collection of machine-readable instructions and/or data, stored in the non-volatile storage 845 and used to create, manage, and control certain software functions described in detail elsewhere in the present disclosure and illustrated in the drawings. In some embodiments, the memory 840 may be much faster than the non-volatile storage 845. In such embodiments, the program 848 may be transferred from the non-volatile storage 845 to the memory 840 prior to being executed by the processor 835.

The computer 805 may communicate and interact with other computers over the network 810 via the network interface 850. The network 810 may include, for example, a local area network (LAN), a wide area network (WAN) such as the Internet, a combination of both the LAN and the WAN, or wired, wireless, or fiber optic connections. In general, the network 810 may be any combination of connections and protocols that support communication between two or multiple computers and associated devices.

The peripheral interface 855 may allow data input/output to and from other devices that may be locally connected with the computer 805. For example, the peripheral interface 855 may provide a connection to an external device 860. The external device 860 may include devices such as a keyboard, a mouse, a keypad, a touchscreen, and/or other suitable input devices. The external device 860 may also include portable computer readable storage media such as, for example, a thumb-drive, a portable optical disc or magnetic disk, and a memory card. Software and data used in embodiments of the present disclosure may be stored, for example, in the program 848, the portable computer readable storage medium, or the like. In such embodiments, software may be loaded onto the non-volatile storage 845 or, alternatively, may be loaded directly into the memory 840 via the peripheral interface 855. The peripheral interface 855 may be connected to the external device 860 using an industry standard connection, such as RS-232 and universal serial bus (USB).

The display interface 865 may connect the computer 805 to a display 870. The display 870, in some embodiments, may be used to present a command line or graphical user interface to a user of the computer 805. The display interface 865 may be connected to the display 870 using one or multiple proprietary connections, or industry standard connections such as VGA, DVI, DisplayPort, HDMI (registered trademark), and the like.

As described above, the network interface 850 provides communication with other computing systems and storage systems or devices outside the computer 805. The software programs and data described in the present specification may be downloaded from, for example, the remote computer 815, the web server 820, the cloud storage server 825, and the computer server 830 to the non-volatile storage 845 via the network interface 850 and the network 810. Further, the systems and methods described in the present disclosure may be executed by one or multiple computers connected to the computer 805 via the network interface 850 and the network 810. For example, in some embodiments, the systems and methods described in the present disclosure may be executed by the remote computer 815, the computer server 830, or a combination of interconnected computers on the network 810.

Data, datasets, and/or databases used in the embodiments of the systems and methods described in the present disclosure may be stored or downloaded from the remote computer 815, the web server 820, the cloud storage server 825, and the computer server 830.

Figure 3:
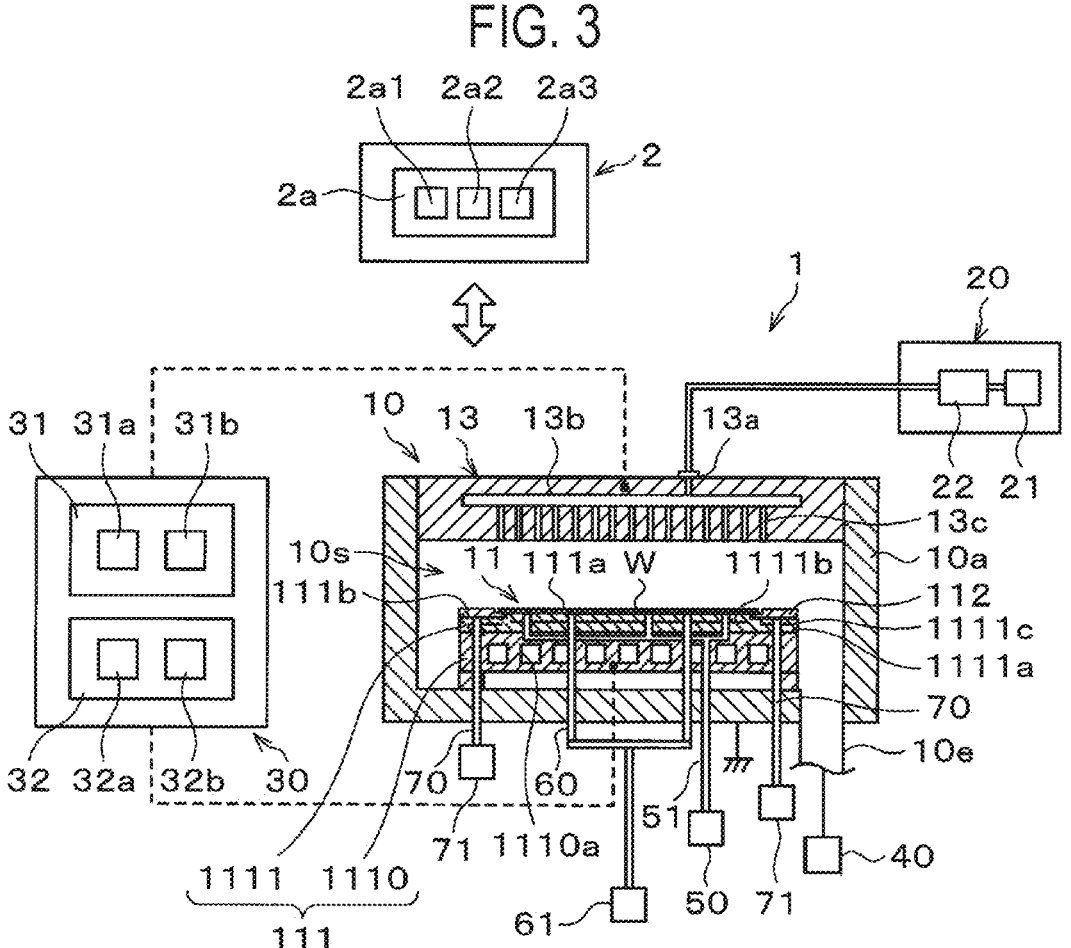
FIG. 3 is a view for explaining a configuration example of a capacitive coupling type of plasma processing apparatus.
Figure 4:
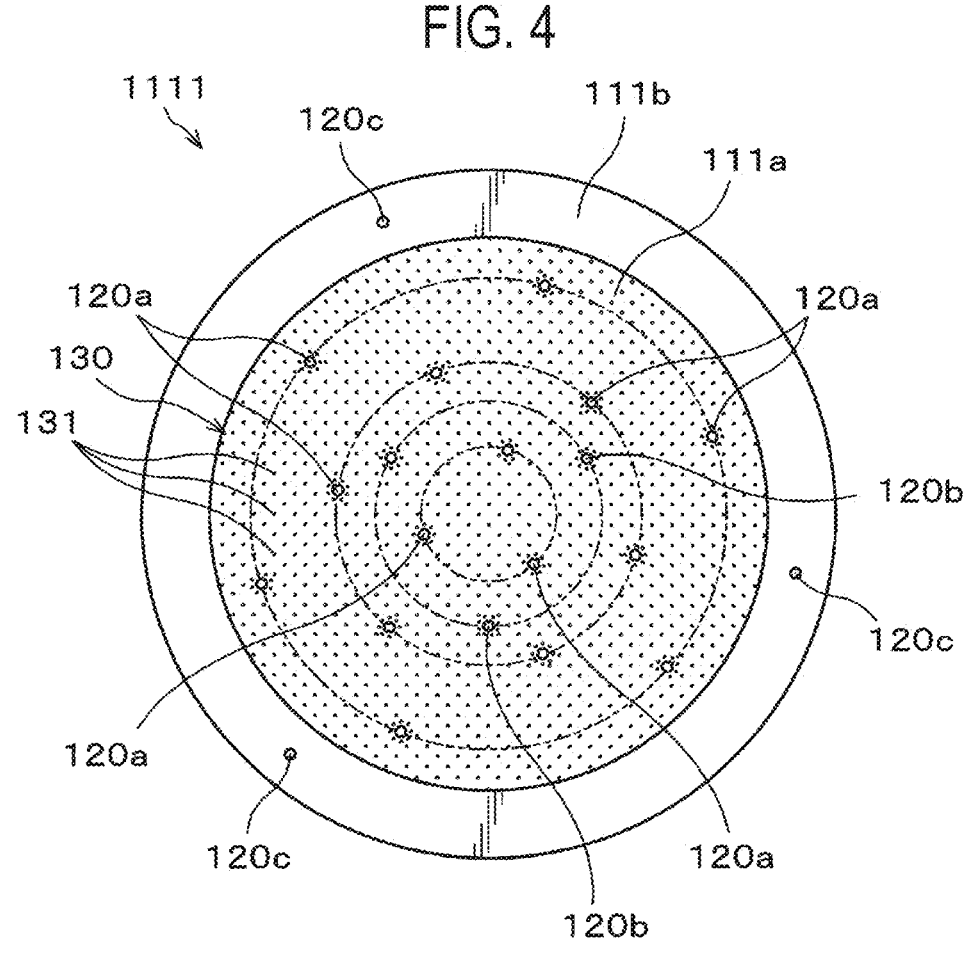
FIG. 4 is a plan view schematically illustrating a configuration of an electrostatic chuck.

Next, a configuration example of a capacitive coupling type of plasma processing apparatus as an example of the plasma processing apparatus 1 will be described. FIG. 3 is a view for explaining a configuration example of a capacitive coupling type of plasma processing apparatus. FIG. 4 is a plan view schematically illustrating a configuration of an electrostatic chuck.

The capacitive coupling type of plasma processing apparatus 1 includes a plasma processing chamber 10, the gas supplier 20, a power supply 30, and the exhaust system 40. The plasma processing apparatus 1 further includes a substrate support 11, as an example of a substrate support, and a gas introducer. The gas introducer is configured to introduce at least one process gas into the plasma processing chamber 10. The gas introducer includes a shower head 13. The substrate support 11 is arranged within the plasma processing chamber 10. The shower head 13 is arranged above the substrate support 11. In an embodiment, the shower head 13 constitutes at least a portion of a ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 is grounded. The shower head 13 and the substrate support 11 are electrically insulated from the housing of the plasma processing chamber 10.

The substrate support 11 includes a main body 111 and a ring assembly 112. The main body 111 has a central region 111a for supporting a substrate W and an annular region 111b for supporting the ring assembly 112. A wafer is an example of the substrate W. The annular region 111b of the main body 111 surrounds the central region 111a of the main body 111 in a plan view. The substrate W is arranged on central region 111a of the main body 111, and the ring assembly 112 is arranged on the annular region 111b of the main body 111 so as to surround the substrate W on the central region 111a of the main body 111. Accordingly, the central region 111a is also referred to as a substrate support surface for supporting the substrate W, and the annular region 111b is also referred to as a ring support surface for supporting the ring assembly 112.

In an embodiment, the main body 111 includes a base 1110 and an electrostatic chuck 1111. The base 1110 includes a conductive member, such as aluminum, and has a sub-stantially disc shape. The conductive member of the base 1110 may function as a lower electrode. The electrostatic chuck 1111 is formed by thermally spraying a sintered body of an insulative material such as ceramic or thermally spraying the insulative material. The electrostatic chuck 1111 is arranged on the base 1110 via a bonding layer arranged therebetween. The bonding layer is formed of a material having plasma resistance and heat resistance. For example, the bonding layer may use acrylic resin, silicone resin, epoxy resin, etc. The electrostatic chuck 1111 includes an insulative member 1111a, and a first electrostatic electrode 1111b and a second electrostatic electrode 1111c arranged in the insulative member 1111a. The insulative member 1111a has the central region 111a. In an embodiment, the insulative member 1111a also has the annular region 111b. The central region 111a and the annular region 111b may be formed integrally or may be formed separately. In an embodiment, the first electrostatic electrode 1111b is used, for example, as an electrode for electrostatically clamping the substrate W supported by the central region 111a. The second electrostatic electrode 1111c is used, for example, as an electrode for electrostatically clamping the ring assembly 112 supported by the annular region 111b surrounding the central region 111a.

In an embodiment, other members surrounding the electrostatic chuck 1111, such as an annular electrostatic chuck or an annular insulating member, may have the annular region 111b. In this case, the ring assembly 112 may be arranged on the annular electrostatic chuck or the annular insulating member or may be arranged on both the electrostatic chuck 1111 and the annular insulating member. In addition, at least one RF/DC electrode coupled to at least one of an RF power supply 31 or a DC power supply 32 described later may be arranged within the insulative member 1111a. In this case, the at least one RF/DC electrode functions as a lower electrode. When at least one of a bias RF signal or DC signal described later is supplied to the at least one RF/DC electrode, the RF/DC electrode is also referred to as a bias electrode. The conductive member of the base 1110 and the at least one RF/DC electrode may function as multiple lower electrodes. The first electrostatic electrode 1111b may also function as the lower electrode. Accordingly, the substrate support 11 includes at least one lower electrode.

The ring assembly 112 includes one or multiple annular members. In an embodiment, the one or multiple annular members include one or multiple edge rings and at least one cover ring. The edge ring is made of a conductive material or an insulating material, and the cover ring is made of an insulating material.

The substrate support 11 may also include a temperature adjustment module configured to adjust at least one of the electrostatic chuck 1111, the ring assembly 112, or the substrate to a target temperature. The temperature adjustment module may include a heater, a heat transfer medium, a flow path 1110a, or a combination thereof. A heat transfer fluid, such as brine or gas, flows through the flow path 1110a. In an embodiment, the flow path 1110a is formed inside the base 1110, and one or multiple heaters are arranged inside the insulative member 1111a of the electrostatic chuck 1111. In addition, the substrate support 11 may include a heat transfer gas supplier 50 configured to supply a heat transfer gas to a gap between a rear surface of the substrate W and the central region 111a. The heat transfer gas supplier 50 supplies the heat transfer gas to gas supply holes 120a (FIG. 4) formed in the electrostatic chuck 1111 via a gas supply path 51. The gas supply holes 120a are through-holes vertically penetrating the electrostatic chuck 1111. In an embodiment, the gas supply holes 120a are arranged at intervals from one another and is arranged concentrically with the center of the central region 111*a* of a circular shape as the center of a circle. The gas supply holes 120*a* may also be used as holes for exhausting the heat transfer gas between the rear surface of the substrate W and the central region 111*a*.

In an embodiment, the electrostatic chuck 1111 has first pin insertion through-holes 120*b* (FIG. 4) as other through-holes in the central region 111*a*. The first pin insertion through-hole 120*b* is a through-hole into which a first lifter pin 60 for supporting and lifting the substrate W is inserted, and extends in a vertical direction. In an embodiment, the first pin insertion through-holes 120*b* are arranged at intervals from each other, and each of the first pin insertion through-holes 120*b* is arranged on the same circumference with the center of the central region 111*a* of a circular shape as the center of a circle. The first lifter pin 60 is configured to be vertically movable by being connected to a driver 61. The driver 61 has, for example, a motor (not illustrated) for generating a lifting driving force.

In an embodiment, the electrostatic chuck 1111 has second pin insertion through-holes 120*c* (FIG. 4) as other through-holes in the annular region 111*b*. The second pin insertion through-hole 120*c* is a through-hole into which a second lifter pin 70 for supporting and lifting the ring assembly 112 is inserted, and extends in the vertical direction. In an embodiment, the second pin insertion through-holes 120*c* are arranged at intervals from each other, and each of the second pin insertion through-holes 120*c* is arranged on the same circumference with the center of the annular region 111*b* of a circular shape as the center of a circle. The second lifter pin 70 is configured to be vertically movable by being connected to a driver 71. The driver 71 has, for example, a motor (not illustrated) for generating a lifting driving force.

The electrostatic chuck 1111 has a substrate contact portion 130 (FIG. 4) that includes protrusions 131. The protrusions 131 are arranged in the central region 111*a* and protrude upward from the central region 111*a*. When the protrusions 131 contact the rear surface of the substrate W, a space is formed between the substrate W and the central region 111*a*, and the heat transfer gas diffuses into this space. A detailed description of the arrangement of the protrusions 131 will be described later.

The shower head 13 is configured to introduce at least one process gas from the gas supplier 20 into the plasma processing space 10*s*. The shower head 13 has at least one gas supply port 13*a*, at least one gas diffusion chamber 13*b*, and gas introduction ports 13*c*. The process gas supplied to the gas supply port 13*a* passes through the gas diffusion chamber 13*b* and is introduced into the plasma processing space 10*s* from the gas introduction ports 13*c*. The shower head 13 may include at least one upper electrode. In addition to the shower head 13, the gas introducer may include one or multiple side gas injectors (SGIs) attached to one or multiple openings formed in the sidewall 10*a*.

The gas supplier 20 may include at least one gas source 21 and at least one flow rate controller 22. In an embodiment, the gas supplier 20 is configured to supply at least one process gas from the corresponding gas source 21 to the shower head 13 via the corresponding flow rate controller 22. Each flow rate controller 22 may include, for example, a mass flow controller or a pressure-controlled flow rate controller. Further, the gas supplier 20 may include at least one flow rate modulation device that modulates or pulses a flow rate of the at least one process gas.

The power supply 30 includes the RF power supply 31 coupled to the plasma processing chamber 10 via at least one impedance matching circuit. The RF power supply 31 is configured to supply at least one RF signal (RF power) to at least one lower electrode and/or at least one upper electrode. Thereby, plasma is formed from at least one process gas supplied to the plasma processing space 10*s*. Accordingly, the RF power supply 31 may function as at least a portion of the plasma generator 12. By supplying the bias RF signal to the at least one lower electrode, a bias potential is generated in the substrate W and an ionic component in the formed plasma may be drawn into the substrate W.

In an embodiment, the RF power supply 31 includes a first RF generator 31*a* and a second RF generator 31*b*. The first RF generator 31*a* is coupled to at least one lower electrode and/or at least one upper electrode via at least one impedance matching circuit and is configured to generate a source RF signal (source RF power) for plasma generation. In an embodiment, the source RF signal has a frequency in a range of 10 MHz to 150 MHz. In an embodiment, the first RF generator 31*a* may be configured to generate source RF signals having different frequencies. The generated one or multiple source RF signals are supplied to at least one lower electrode and/or at least one upper electrode.

The second RF generator 31*b* is coupled to the at least one lower electrode via the at least one impedance matching circuit and is configured to generate a bias RF signal (bias RF power). The frequency of the bias RF signal may be the same as or different from the frequency of the source RF signal. In an embodiment, the bias RF signal has a lower frequency than the frequency of the source RF signal. In an embodiment, the bias RF signal has a frequency in a range of 100 kHz to 60 MHz. In an embodiment, the second RF generator 31*b* may be configured to generate bias RF signals having different frequencies. The generated one or multiple bias RF signals are supplied to the at least one lower electrode. In various embodiments, at least one of the source RF signal or the bias RF signal may be pulsed.

The power supply 30 may include the DC power supply 32 coupled to the plasma processing chamber 10. The DC power supply 32 includes a first DC generator 32*a* and a second DC generator 32*b*. In an embodiment, the first DC generator 32*a* is connected to the at least one lower electrode and is configured to generate a first DC signal. The generated first DC signal is applied to the at least one lower electrode. In an embodiment, the second DC generator 32*b* is connected to the at least one upper electrode and is configured to generate a second DC signal. The generated second DC signal is applied to the at least one upper electrode.

In various embodiments, the first and second DC signals may be pulsed. In this case, a sequence of voltage pulses is applied to the at least one of the lower electrode or the upper electrode. The voltage pulse may have a rectangular pulse waveform, a trapezoidal pulse waveform, a triangular pulse waveform, or a combination thereof. In an embodiment, a waveform generator for generating a sequence of voltage pulses from a DC signal is connected between the first DC generator 32*a* and the at least one lower electrode. Accordingly, the first DC generator 32*a* and the waveform generator constitute a voltage pulse generator. When the second DC generator 32*b* and the waveform generator constitute the voltage pulse generator, the voltage pulse generator is connected to the at least one upper electrode. The voltage pulse may have a positive polarity and may have a negative polarity. Further, the sequence of voltage pulses may include one or multiple positive polarity voltage pulses and one or multiple negative polarity voltage pulses in one cycle. The first and second DC generators 32a and 32b may be installed in addition to the RF power supply 31, or the first DC generator 32a may be installed instead of the second RF generator 31b.

The exhaust system 40 may be connected to, for example, a gas discharging port 10e disposed at the bottom of the plasma processing chamber 10. The exhaust system 40 may include a pressure regulating valve and a vacuum pump. Pressure in the plasma processing space 10s is adjusted by the pressure regulating valve. The vacuum pump may include a turbomolecular pump, a dry pump, or a combination thereof.

Next, the arrangement of the protrusions 131 included in the electrostatic chuck 1111 will be described by taking various embodiments as examples.

First Embodiment

Figures 5, 6:
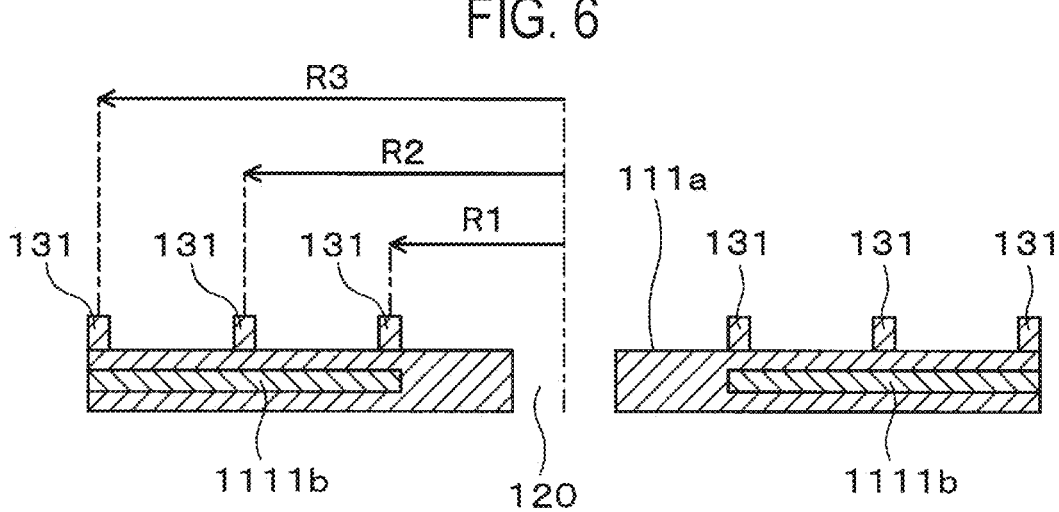
FIG. 5 is an enlarged plan view of the periphery of a through-hole of an electrostatic chuck according to a first embodiment.
FIG. 6 is a longitudinal cross-sectional view of the periphery of the through-hole illustrated in FIG. 5.

FIG. 5 is an enlarged plan view of the periphery of a through-hole of an electrostatic chuck according to a first embodiment. FIG. 6 is a longitudinal cross-sectional view of the periphery of the through-hole illustrated in FIG. 5.

In this embodiment, ten protrusions 131 are arranged at a position of a radius R1 from the center of a through-hole 120 (e.g., the gas supply hole 120a or the first pin insertion through-hole 120b illustrated in FIG. 4). Further, ten protrusions are arranged at a position of a radius R2 from the center of the through-hole 120 and sixteen protrusions are arranged at a position of a radius R3 from the center of the through-hole 120. Each protrusion 131 is arranged concentrically with the center of the through-hole 120 as the center of a circle. When the through-hole 120 is a hole for inserting the first lifter pin 60, the radius R1 is, for example, 3.9 mm. When the through-hole 120 is a hole for supplying a heat transfer gas, the radius R1 is, for example, 3.55 mm. A desirable distance from the through-hole 120 to each protrusion 131 is appropriately changed according to the positional relationship between the through-hole 120 and the first electrostatic electrode 1111b.

In the substrate contact portion 130 in which the protrusions 131 are arranged as described above, the density of the protrusions 131 in a radial direction of the through-hole 120 differs. The "density of protrusions" in the present specification is the number of protrusions 131 per unit area. In this embodiment, the number of protrusions 131 per unit area in a region from the center of the through-hole 120 to the position of the radius R1 is greater than the number of protrusions 131 per unit area in a region from the position of the radius R1 to the position of the radius R3. Therefore, the substrate contact portion 130 according to the present embodiment includes a first substrate contact portion 130a and a second substrate contact portion 130b having different densities of the protrusions 131 in the radial direction of the through-hole 120.

The first substrate contact portion 130a is arranged around the through-hole 120, and the second substrate contact portion 130b is arranged around the first substrate contact portion 130a. When the density of the protrusions 131 in the first substrate contact portion 130a is defined as a first density, the protrusions 131 are arranged in the second substrate contact portion 130b at a second density lower than the first density. That is, the electrostatic chuck 1111 according to the present embodiment has the first substrate contact portion 130a in which the protrusions 131 are arranged at the first density and the second substrate contact portion 130b in which the protrusions 131 are arranged at the second density lower than the first density.

When the protrusions 131 contact the substrate W, heat is transferred from the substrate W to the protrusions 131 by heat conduction, and the substrate W is cooled. As a result, as the number of protrusions 131 increases, the cooling capacity of the substrate W is raised. Accordingly, the first substrate contact portion 130a having a higher density of the protrusions 131 than the second substrate contact portion 130b is present around the through-hole 120, thereby locally increasing the cooling capacity of the substrate W in the vicinity of the through-hole 120. This makes it possible to suppress an increase in the local temperature of the substrate W in the vicinity of the through-hole 120 during plasma processing. That is, the electrostatic chuck 1111 according to the present embodiment may suppress the occurrence of temperature singularity of the substrate W in the vicinity of the through-hole 120.

As long as the condition that the second density is lower than the first density is satisfied, the arrangement of the protrusions 131 and the number of protrusions 131 are not particularly limited. Further, for example, the protrusions 131 may not be arranged concentrically. However, the region of local temperature rise of the substrate W in the vicinity of the through-hole 120 tends to have a circular shape. Therefore, from the viewpoint of uniformly cooling the region of local temperature rise of the substrate W, it is desirable that the protrusions 131 of the first substrate contact portion 130a are arranged concentrically with the center of the through-hole 120 as the center of a circle.

At least a portion of the first substrate contact portion 130a is desirably located above the first electrostatic electrode 1111b disposed inside the electrostatic chuck 1111. This may increase the adsorption force of the first substrate contact portion 130a with respect to the substrate W and increase the contact area of the first substrate contact portion 130a with respect to the substrate W. As a result, the amount of heat transferred from the substrate W to the first substrate contact portion 130a due to heat conduction increases, and the local temperature rise of the substrate W may be effectively suppressed.

Second Embodiment

Figure 7:
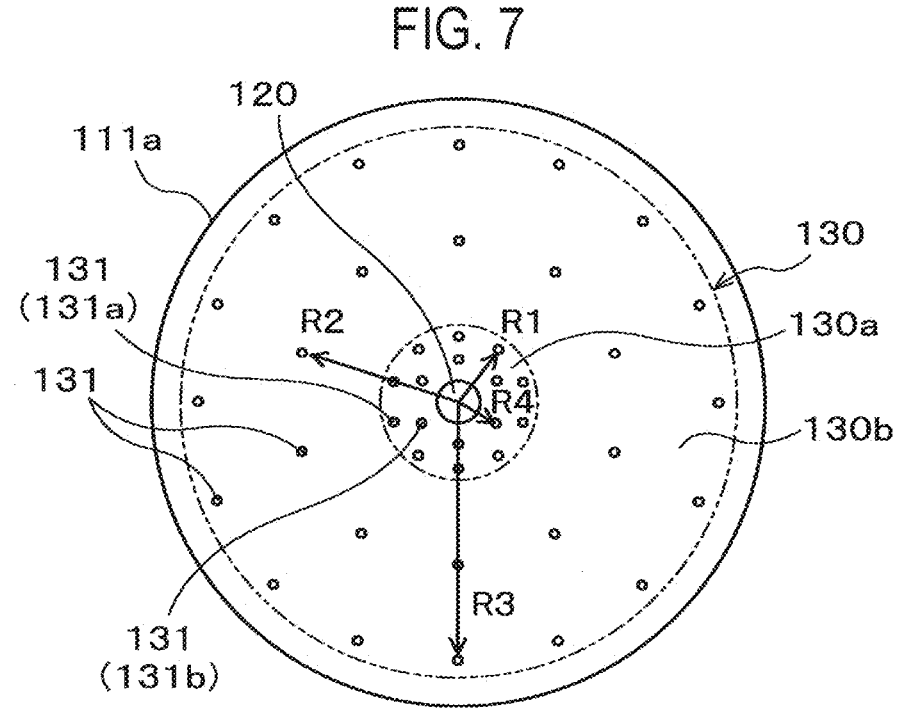
FIG. 7 is an enlarged plan view of the periphery of a through-hole of an electrostatic chuck according to a second embodiment.
Figure 8:
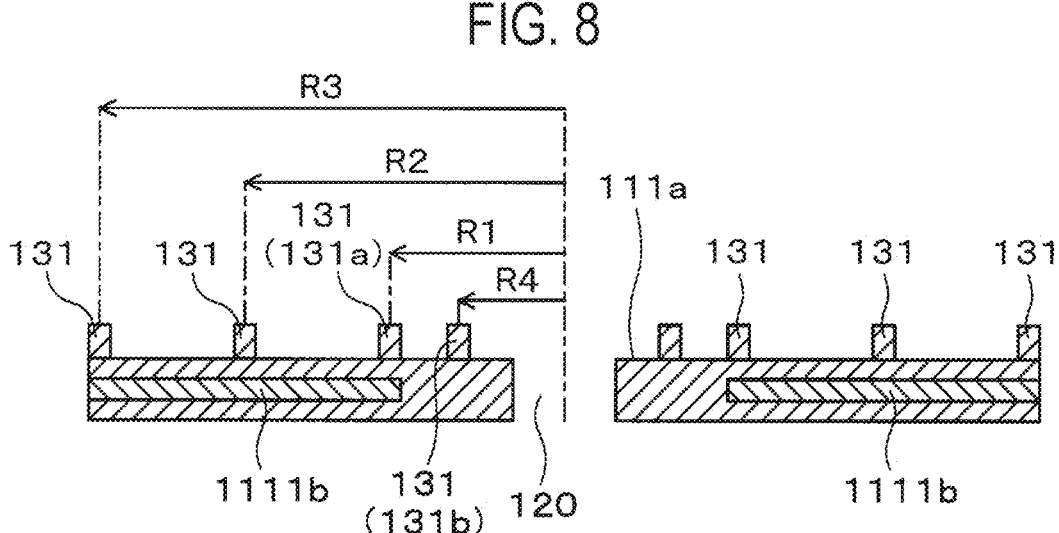
FIG. 8 is a longitudinal cross-sectional view of the periphery of the through-hole illustrated in FIG. 7.

FIG. 7 is an enlarged plan view of the periphery of a through-hole of an electrostatic chuck according to a second embodiment. FIG. 8 is a longitudinal cross-sectional view of the periphery of the through-hole illustrated in FIG. 7.

The first substrate contact portion 130a in the present embodiment has protrusions 131a (hereinafter referred to as "end protrusions") arranged above an end of the first electrostatic electrode 1111b in a side of the through-hole 120. Ten end protrusions 131a are arranged at a position of the radius R1 from the center of the through-hole 120. The first substrate contact portion 130a has protrusions 131b (hereinafter referred to as "inner protrusions") arranged on an inner side of the end protrusions 131a in a radial direction of the through-hole 120 (on the center side of the through-hole 120). Six inner protrusions 131b are arranged at a position of a radius R4 from the center of the through-hole 120. Each protrusion 131 is arranged concentrically with the center of the through-hole 120 as the center of a circle. When the through-hole 120 is a hole for inserting the first lifter pin 60, the radius R1 is, for example, 3.9 mm, and the radius R4 is, for example, 2.5 mm. If the through-hole 120 is a hole for supplying the heat transfer gas, the radius R1 is, for example, 3.55 mm, and the radius R4 is, for example, 1.78 mm. A desirable distance of each protrusion 131 including the end protrusion 131a and the inner protrusion 131b from the through-hole 120 is appropriately changed according to the positional relationship between the through-hole 120 and the first electrostatic electrode 1111b.

Even in the electrostatic chuck 1111 according to the present embodiment, the density of the protrusions 131 arranged in the first substrate contact portion 130a is higher than the density of the protrusions 131 arranged in the second substrate contact portion 130b. Therefore, the cooling capacity of the substrate W at the first substrate contact portion 130a is higher than that of the second substrate contact portion 130b. Further, since the inner protrusions 131b are disposed on the first substrate contact portion 130a, the cooling capacity of the substrate W at the first substrate contact portion 130a is improved. Therefore, by the electrostatic chuck 1111 according to the present embodiment, it becomes easier to further suppress the local temperature rise of the substrate W in the vicinity of the through-hole 120.

Third Embodiment

Figures 9, 10:
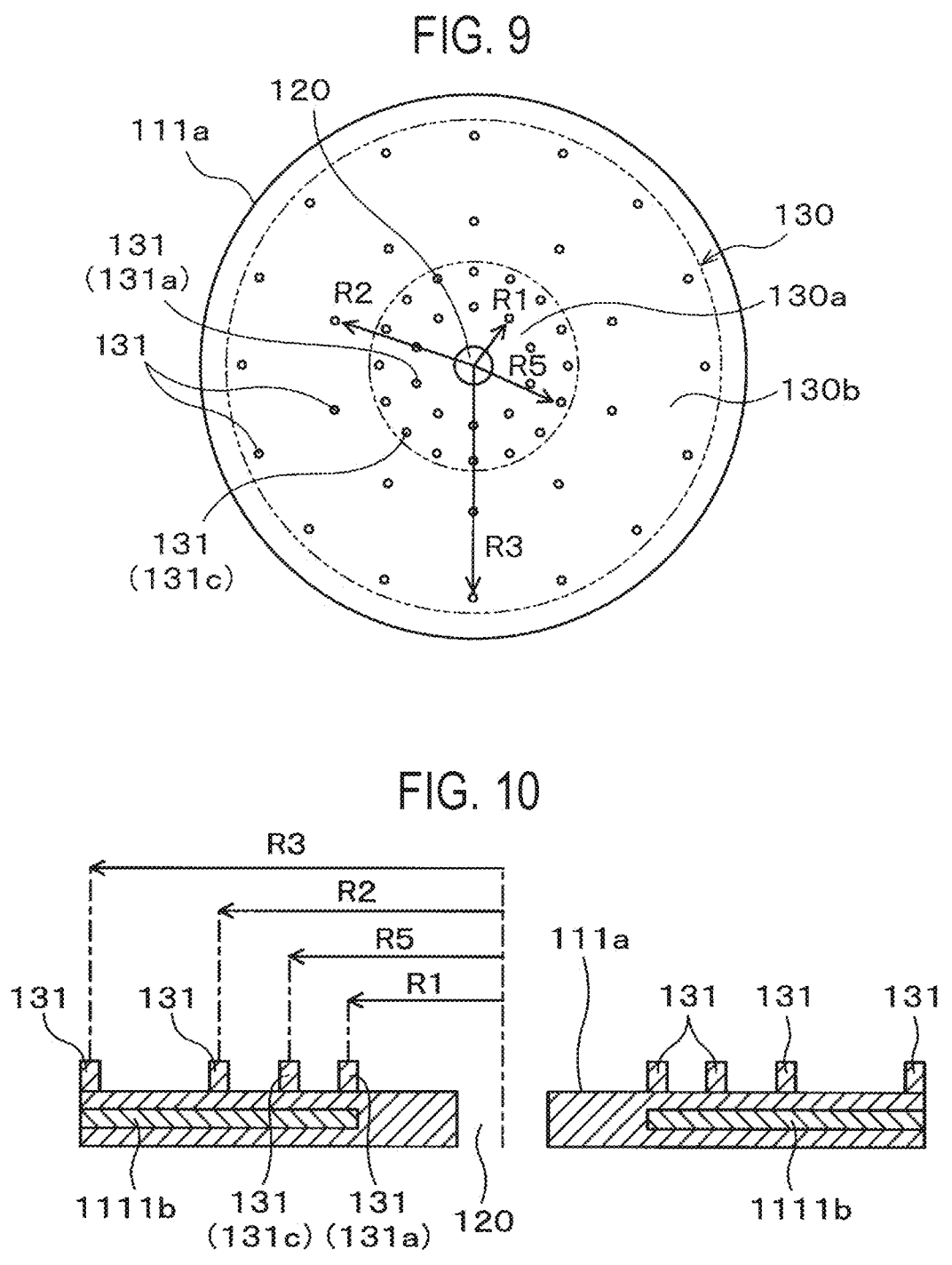

FIG. 9 is an enlarged plan view of the periphery of a through-hole of an electrostatic chuck according to a third embodiment. FIG. 10 is a longitudinal cross-sectional view of the periphery of the through-hole illustrated in FIG. 9.

The first substrate contact portion 130a in the present embodiment has protrusions 131c (hereinafter referred to as "outer protrusions") arranged on an outer side of the end protrusions 131a in a radial direction of the through-hole 120 (on an opposite side of the center side of the through-hole 120). Sixteen outer protrusions 131c are arranged at a position of a radius R5 from the center of the through-hole 120. Each protrusion 131 is arranged concentrically with the center of the through-hole 120 as the center of a circle. When the through-hole 120 is a hole for inserting the first lifter pin 60, the radius R1 is, for example, 3.9 mm, and the radius R5 is, for example, 6.2 mm. When the through-hole 120 is a hole for supplying the heat transfer gas, the radius R1 is, for example, 3.55 mm, and the radius R5 is, for example, 5.85 mm. A desirable distance of each protrusion 131 including the end protrusion 131a and the outer protrusion 131c from the through-hole 120 is appropriately changed according to the positional relationship between the through-hole 120 and the first electrostatic electrode 1111b.

Even in the electrostatic chuck 1111 according to the present embodiment, the density of the protrusions 131 arranged in the first substrate contact portion 130a is higher than the density of the protrusions 131 arranged in the second substrate contact portion 130b. Therefore, the cooling capacity of the substrate W at the first substrate contact portion 130a is high relative to the second substrate contact portion 130b. Further, since the outer protrusions 131c are disposed on the first substrate contact portion 130a, the cooling capacity of the substrate W at the first substrate contact portion 130a is improved. Therefore, by the electrostatic chuck 1111 according to the present embodiment, it becomes easier to further suppress the local temperature rise of the substrate W in the vicinity of the through-hole 120.

Fourth Embodiment

Figure 11:
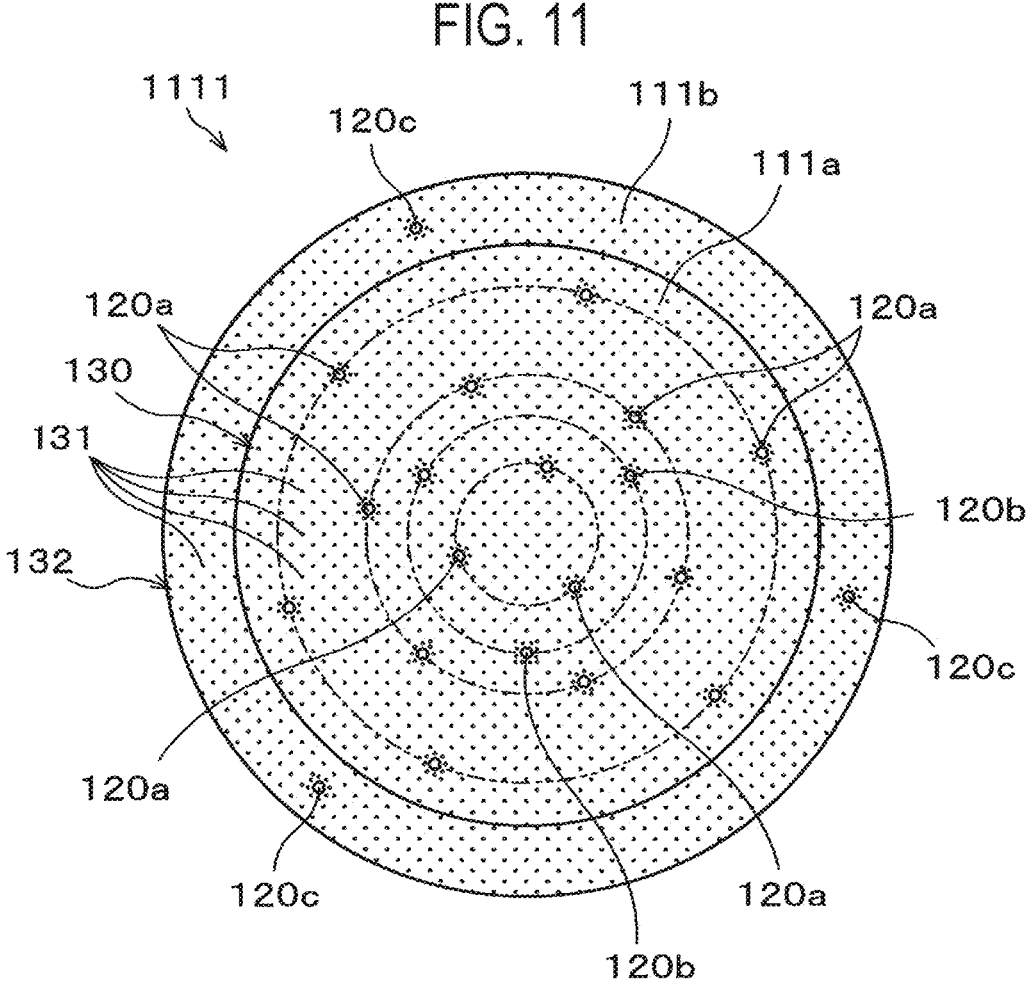
FIG. 11 is a plan view schematically illustrating a configuration of an electrostatic chuck according to a fourth embodiment.
Figure 12:
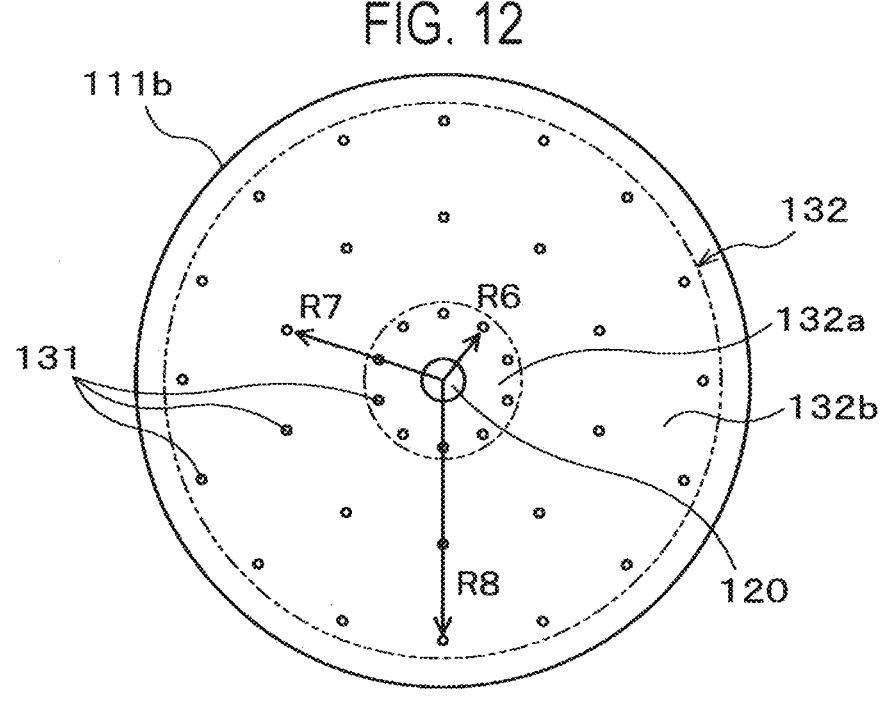
FIG. 12 is an enlarged plan view of the periphery of a through-hole formed in an annular region of an electrostatic chuck.
Figure 13:
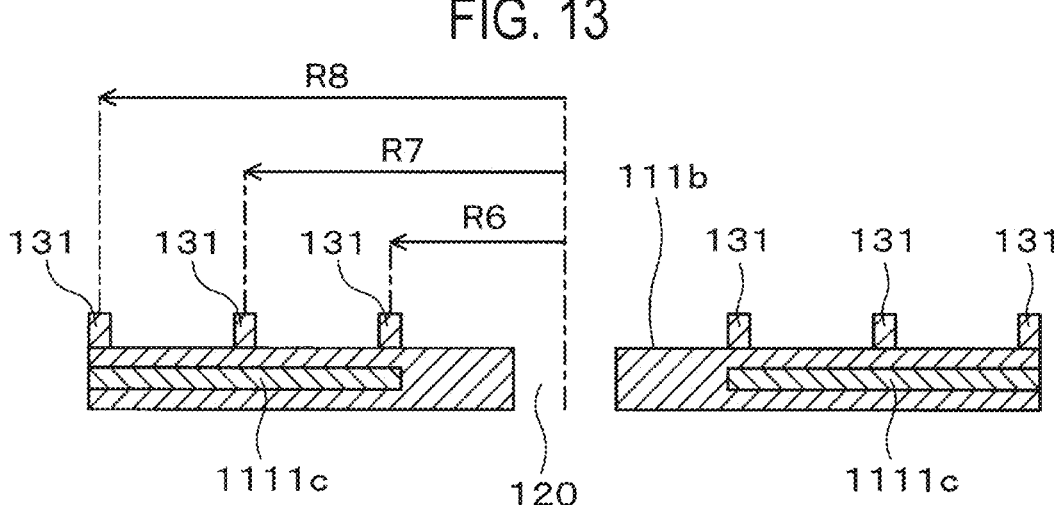
FIG. 13 is a longitudinal cross-sectional view of the periphery of the through-hole illustrated in FIG. 12.

FIG. 11 is a plan view schematically illustrating a configuration of an electrostatic chuck according to a fourth embodiment. FIG. 12 is an enlarged plan view of the periphery of a through-hole formed in an annular region of an electrostatic chuck. FIG. 13 is a longitudinal cross-sectional view of the periphery of the through-hole illustrated in FIG. 12.

In addition to the substrate contact portion 130, the electrostatic chuck 1111 according to the present embodiment has a ring contact portion 132 in the annular region 111b. The ring contact portion 132 has protrusions 131 protruding upward from the annular region 111b.

Ten protrusions 131 of the annular region 111b are arranged at a position of a radius R6 from the center of the through-hole 120 (e.g., the second pin insertion through-hole 120c illustrated in FIG. 11). Ten protrusions 131 are arranged at a position of a radius R7 from the center of the through-hole 120 and sixteen protrusions 131 are arranged at a position of a radius R8 from the center of the through-hole 120. Each protrusion 131 is arranged concentrically with the center of the through-hole 120 as the center of a circle. A desirable distance from the through-hole 120 to each protrusion 131 is appropriately changed according to the positional relationship between the through-hole 120 and the second electrostatic electrode 1111c.

As described above, the ring contact portion 132 in which the protrusions 131 are arranged has a first ring contact portion 132a and a second ring contact portion 132b having different densities of the protrusions 131 in a radial direction of the through-hole 120. The first ring contact portion 132a is arranged around the through-hole 120, and the second ring contact portion 132b is arranged around the first ring contact portion 132a. When the density of the protrusions 131 in the first ring contact portion 132a is defined as a third density, the protrusions 131 are arranged in the second ring contact portion 132b at a fourth density lower than the third density. That is, the electrostatic chuck 1111 according to the present embodiment has the first ring contact portion 132a in which the protrusions 131 are arranged at the third density and the second ring contact portion 132b in which the protrusions 131 are arranged at the fourth density lower than the third density.

When performing plasma processing, the local temperature rise of the ring assembly 112 occurs in the vicinity of the through-hole 120 of the annular region 111b, and there is concern that temperature singularity may occur at a peripheral portion of the substrate W. On the other hand, in the electrostatic chuck 1111 according to the present embodiment, the first ring contact portion 132a having a higher density of the protrusions 131 than that of the second ring contact portion 132b is present around the through-hole 120. Thus, the cooling capacity of the ring assembly 112 in the vicinity of the through-hole 120 may be locally increased. This makes it possible to suppress the local temperature rise of the ring assembly 112 that may occur in the vicinity of the through-hole 120 during plasma processing and to suppress the occurrence of temperature singularity at the peripheral portion of the substrate W.

As long as the condition that the third density is lower than the fourth density is satisfied, the arrangement of the protrusions 131 and the number of protrusions 131 in the ring contact portion 132 are not particularly limited. For example, the inner protrusions 131b or the outer protrusions 131c described in the second embodiment and the third embodiment may be applied to the ring contact portion 132.

While the arrangement of the protrusions 131 disposed on the electrostatic chuck 1111 has been described in the first to fourth embodiments above, the protrusions 131 may be appropriately arranged by combining the arrangements described in the first to fourth embodiments. The shape of the protrusions 131 in a plan view is not particularly limited and may be circular, triangular, square, or other shapes. In the case of the circular protrusions 131, the protrusions 131 have a diameter of, for example, 0.2 to 1.0 mm. The respective protrusions 131 may not have the same shape. The heights of the respective protrusions 131 (the heights from the central region 111*a* or the annular region 111*b* to an upper end of the protrusion 131) may not be the same height. The first density and the third density may be the same or different, and the second density and the fourth density may be the same or different.

In the above embodiments, while the gas supply hole 120*a*, the first pin insertion through-hole 120*b*, and the second pin insertion through-hole 120*c* have been exemplified as usage of the through-hole 120, the usage of the through-hole 120 is not particularly limited. For example, the through-hole 120 may be a hole into which a temperature sensor for measuring the temperature of the substrate is inserted. By providing the first substrate contact portion 130*a* and the second substrate contact portion 130*b* having different densities in a radial direction of the through-hole, the effect of suppressing the occurrence of temperature singularity of the substrate W in the vicinity of the through-hole as described above is obtained. Further, the number of through-holes is not particularly limited. Even if the number of through-holes is one, the effect of suppressing the occurrence of temperature-singularity of the substrate W in the vicinity of the through-hole may be obtained by applying the electrostatic chuck 1111 as described in the above embodiment to the through-hole.

It is to be noted that the embodiments disclosed herein are exemplary in all respects and are not restrictive. The above-described embodiments may be omitted, replaced, and/or modified in various forms without departing from the scope and spirit of the appended claims.

According to the present disclosure, it is possible to suppress the occurrence of temperature singularity of a substrate in the vicinity of a through-hole of an electrostatic chuck.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An electrostatic chuck, comprising:
a central region configured to support a substrate;
at least one through-hole formed in the central region for inserting a first lifter pin;
a first substrate contact portion arranged around the through-hole; and
a second substrate contact portion arranged around the first substrate contact portion,
wherein the first substrate contact portion and the second substrate contact portion have protrusions protruding upward from the central region,
wherein the protrusions are arranged in the first substrate contact portion at a first density,
wherein the protrusions are arranged in the second substrate contact portion at a second density lower than the first density,
wherein the through-hole is further formed in an annular region configured to support a ring assembly,
wherein the electrostatic chuck further includes a first ring contact portion arranged around the through-hole formed in the annular region, and a second ring contact portion arranged around the first ring contact portion,
wherein the first ring contact portion and the second ring contact portion have protrusions protruding upward from the annular region,
wherein the protrusions are arranged in the first ring contact portion at a third density, and
wherein the protrusions are arranged in the second ring contact portion at a fourth density lower than the third density.

2. The electrostatic chuck of claim 1, wherein the protrusions of the first substrate contact portion are arranged concentrically with the through-hole as a center.

3. The electrostatic chuck of claim 2, further comprising an electrostatic electrode configured to clamp the substrate,
wherein at least a portion of the first substrate contact portion is located above the electrostatic electrode.

4. The electrostatic chuck of claim 3, wherein the protrusions of the first substrate contact portion include an end protrusion arranged above an end of the electrostatic electrode in a side of the through-hole.

5. The electrostatic chuck of claim 4, wherein the protrusions of the first substrate contact portion include an inner protrusion arranged on an inner side of the end protrusion in a radial direction of the through-hole.

6. The electrostatic chuck of claim 5, wherein the inner protrusion is arranged on a first circumference with the through-hole as the center.

7. The electrostatic chuck of claim 6, wherein the protrusions of the first substrate contact portion include an outer protrusion arranged on an outer side of the end protrusion in the radial direction of the through-hole.

8. The electrostatic chuck of claim 7, wherein the outer protrusion is arranged on a second circumference with the through-hole as the center.

9. The electrostatic chuck of claim 1, wherein the through-holes include a hole for inserting a lifter pin.

10. The electrostatic chuck of claim 9, wherein the through-holes include a hole for supplying a heat transfer gas to control a temperature of the substrate.

11. A substrate support, comprising:
a base; and
an electrostatic chuck disposed on an upper portion of the base,
wherein the electrostatic chuck includes:
a central region configured to support a substrate;
at least one through-hole formed in the central region;
a first substrate contact portion arranged around the through-hole; and
a second substrate contact portion arranged around the first substrate contact portion,
wherein the first substrate contact portion and the second substrate contact portion have protrusions protruding upward from the central region,
wherein the protrusions are arranged in the first substrate contact portion at a first density,
wherein the protrusions are arranged in the second substrate contact portion at a second density lower than the first density,
wherein the through-hole is further formed in an annular region configured to support a ring assembly,
wherein the electrostatic chuck further includes a first ring contact portion arranged around the through-hole formed in the annular region, and a second ring contact portion arranged around the first ring contact portion, wherein the first ring contact portion and the second ring contact portion have protrusions protruding upward from the annular region, wherein the protrusions are arranged in the first ring contact portion at a third density, and wherein the protrusions are arranged in the second ring contact portion at a fourth density lower than the third density.

12. The substrate support of claim 11, wherein the protrusions of the first substrate contact portion are arranged concentrically with the through-hole as a center.

13. The substrate support of claim 12, further comprising an electrostatic electrode configured to clamp the substrate, wherein at least a portion of the first substrate contact portion is located above the electrostatic electrode.

14. The substrate support of claim 13, wherein the protrusions of the first substrate contact portion include an end protrusion arranged above an end of the electrostatic electrode in a side of the through-hole.

15. The substrate support of claim 14, wherein the protrusions of the first substrate contact portion include an inner protrusion arranged on an inner side of the end protrusion in a radial direction of the through-hole.

16. The substrate support of claim 15, wherein the inner protrusion is arranged on a first circumference with the through-hole as the center.

17. The substrate support of claim 16, wherein the protrusions of the first substrate contact portion include an outer protrusion arranged on an outer side of the end protrusion in the radial direction of the through-hole.

18. The substrate support of claim 17, wherein the outer protrusion is arranged on a second circumference with the through-hole as the center.

19. A substrate processing apparatus, comprising:

a plasma processing chamber; and a substrate support disposed inside the plasma processing chamber, wherein the substrate support includes:

a base; and an electrostatic chuck disposed on an upper portion of the base, wherein the electrostatic chuck includes:

a central region configured to support a substrate;

at least one through-hole formed in the central region;

a first substrate contact portion arranged around the through-hole; and a second substrate contact portion arranged around the first substrate contact portion, wherein the first substrate contact portion and the second substrate contact portion have protrusions protruding upward from the central region, wherein the protrusions are arranged in the first substrate contact portion at a first density, wherein the protrusions are arranged in the second substrate contact portion at a second density lower than the first density, wherein the through-hole is further formed in an annular region configured to support a ring assembly, wherein the electrostatic chuck further includes a first ring contact portion arranged around the through-hole formed in the annular region, and a second ring contact portion arranged around the first ring contact portion, wherein the first ring contact portion and the second ring contact portion have protrusions protruding upward from the annular region, wherein the protrusions are arranged in the first ring contact portion at a third density, and wherein the protrusions are arranged in the second ring contact portion at a fourth density lower than the third density.

* * * * *